United States Patent [19]

Bahl

[11] Patent Number: 5,428,327
[45] Date of Patent: Jun. 27, 1995

[54] MICROWAVE FEEDTHROUGH APPARATUS

[75] Inventor: Inder J. Bahl, Roanoke, Va.

[73] Assignee: ITT Corporation, New York, N.Y.

[21] Appl. No.: 110,583

[22] Filed: Aug. 23, 1993

[51] Int. Cl.$^6$ .......................... H01P 1/00; H01P 3/08
[52] U.S. Cl. ..................................... 333/246; 333/247
[58] Field of Search ................. 333/246, 247, 238; 257/664, 691, 728

[56] References Cited

U.S. PATENT DOCUMENTS

| | | | |
|---|---|---|---|
| 4,922,325 | 5/1990 | Smeltz, Jr. | 333/247 |
| 5,235,208 | 8/1993 | Katoh | 333/247 |

FOREIGN PATENT DOCUMENTS

| | | | |
|---|---|---|---|
| 0059004 | 3/1988 | Japan | 333/247 |
| 0064202 | 3/1991 | Japan | 333/238 |

OTHER PUBLICATIONS

"GaAs SAMP Device for Ku-Band Switching" IEEE Transactions on Microwave Theory and Techniques, Fleming et al., vol. MTT-27, No. 12, Dec. 79' pp. 1032–1035.

Primary Examiner—Benny Lee
Assistant Examiner—Darius Gambino
Attorney, Agent, or Firm—Arthur L. Plevy; Patrick M. Hogan

[57] ABSTRACT

An improved microwave feedthru apparatus is disclosed which provides enhanced performance over the 1–20 GHz frequency range. In its preferred embodiment the apparatus will be used to transmit microwave signals into and out of monolithic microwave integrated circuit (MMIC) packages. The apparatus utilizes a co-planar waveguide (CPW) transmission line section to guide the microwave signal through the wall of the package, substantially free of any in band resonance effects.

18 Claims, 9 Drawing Sheets

MICROWAVE FEEDTHROUGH APPARATUS

This invention was made with government support under contract DAAL01-89-C-0908 awarded by the Department of the Army.

FIELD OF INVENTION

This invention relates to microwave integrated circuit packages generally, and more particularly to a microwave feedthrough device having improved operating characteristics.

BACKGROUND OF INVENTION

Monolithic microwave integrated circuits (MMICs) are becoming more and more prevalent in the microwave industry due to their small size and weight, enhanced performance, increased reliability, and low cost. Circuits which in the past consisted of many discrete elements connected together in some complex configuration can now be put on a single chip of considerably smaller dimensions with no significant reduction in performance. Before these MMIC chips can be marketed and used in systems, however, they have to be packaged. These packages allow users to simply drop the MMICs into predesigned circuits without the need for intricate wire bonding to the chip itself. They also protect the chip from potentially damaging environmental conditions, such as ambient moisture level and salt atmosphere, and from contamination. A problem which arises with MMIC packaging is that the packages themselves can severely limit the performance of the chip. Therefore, it is a priority that any performance limiting aspects of the packaging be discovered and adequately dealt with.

The microwave performance limitation of MMIC packages is known to be caused in large part by poor feedthrough designs. A feedthrough is simply a port through which microwave energy is transmitted into or out of a microwave package. In more general terms, it is a device for transmitting electromagnetic energy through an aperture in a conductive surface. It is very important to the overall performance of the MMIC that the RF feedthrough provide low insertion loss, high return loss, and no resonances over the operating frequency range of the MMIC chip. As MMIC chips achieve higher and higher frequency capabilities, the performance of the feedthroughs becomes more and more critical.

The basic electrical requirements of a feedthrough are a return loss greater than 15 dB and an insertion loss of less than 0.02 dB/GHz, across the entire operational frequency range of the chip, when matched into a 50 Ω line. In employing the known prior art, it is difficult to achieve such performance goals over the entire 1–20 GHz frequency range.

Figure 1A:
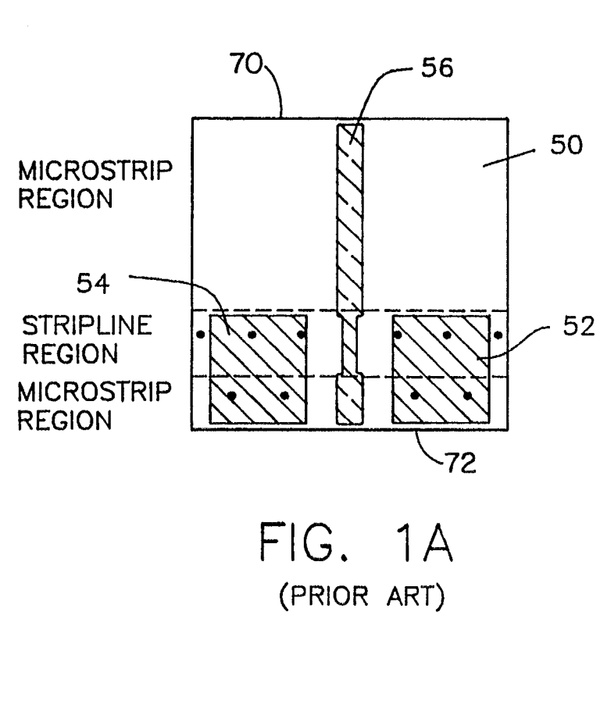
FIG. 1A is a top view of the feedthrough metallization configuration of a prior art device.
Figure 1B:
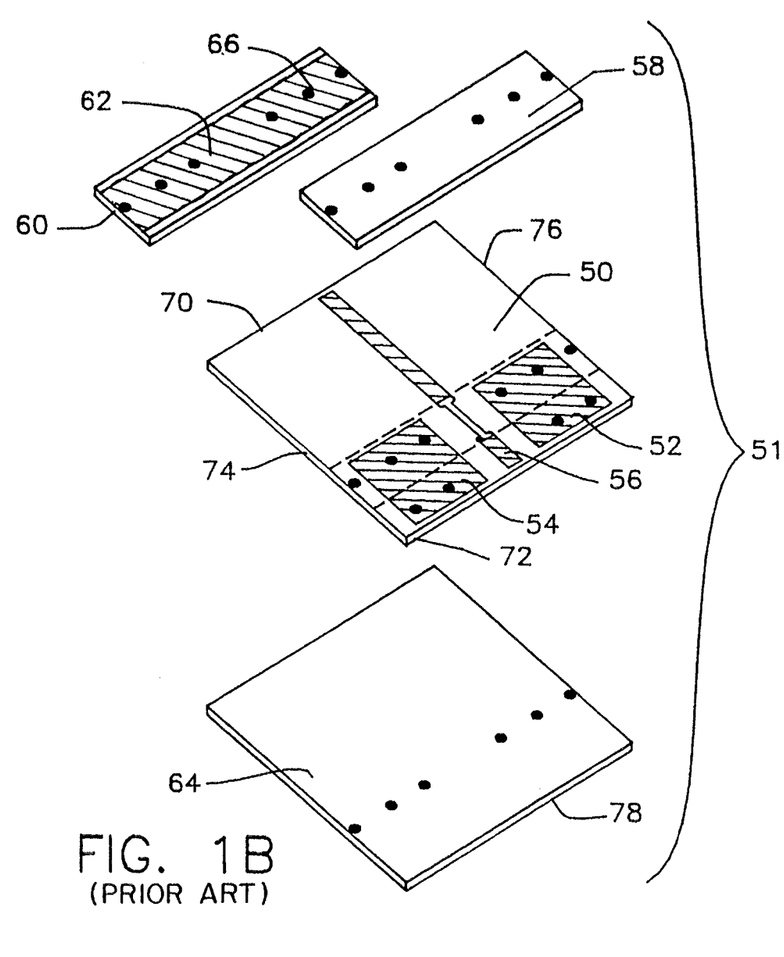
FIG. 1B is an exploded perspective view of a prior art device.

FIGS. 1A and 1B show the feedthrough structure of a typical prior art microwave package. This structure employs multilayer, ceramic, thick film technology using 20 mil thick, 94% alumina substrates, and tungsten, nickel, and gold metallization. Referring to the figure, the device includes ceramic substrates 50, 58, 60, and 64. Deposited upon the upper surface of substrate 50 is conductive strip 56 and conductive ground pads 52 and 54. The conductive strip extends from edge 72 of substrate 50 to edge 70 of said substrate, and is centered on said substrate between edges 74 and 76. The conductive strip has a section of reduced width situated between two sections of equal width.

Conductive ground pads 52 and 54 are situated one on each side of said strip, and equidistant from said strip, and extend from edge 72 to a point even with the far end of the section of reduced width of said conductive strip. Substrate 58 is situated on top of substrate 50 and covers the section of reduced width of the conductive strip, a small portion of each of the sections of equal width of the conductive strip, and a considerable portion of each of the two conductive ground pads. Substrate 60 is situated on top of substrate 58 and fully covers it. Substrate 60 has conductive ground plane 62 deposited on its upper surface. Substrate 64 is situated below substrate 50 and fully covers its lower surface. Substrate 64 has conductive ground plane 78 deposited on and fully covering its lower surface.

A plurality of via holes 66 are made through the planar substrates for the purpose of creating electrical continuity between conductive ground plane 62, conductive ground plane 78, and conductive ground pads 52 and 54. These holes have their inner surfaces metalized to provide such continuity.

Each of the two sections of equal width of conductive strip 56, in conjunction with substrates 50 and 64, and conductive ground plane 78, acts as the center conductor of a microstrip transmission line section in its respective region. The section of reduced width of the conductive strip, in conjunction with substrates 50, 58, 60, and 64, and conductive ground planes 62 and 78, acts as the center conductor of a stripline transmission line section in its region. Conductive ground pads 52 and 54 act to suppress radiated power by providing a low impedance ground path.

When implemented to transmit microwave energy through the wall of a MMIC package, the device will be situated in an aperture in said wall so that the periphery of said aperture surrounds the device across the top of substrate 60, down each side of said device, and across the bottom of substrate 64. The length of substrate 60 will be equal to the thickness of the wall. When operating, a microwave signal will be applied to conductive strip 56 at either edge 70 or edge 72 and this signal will be transmitted to the opposite edge, through the three separate transmission media, from which it will then be transmitted away from the device by an external means.

Figure 2:
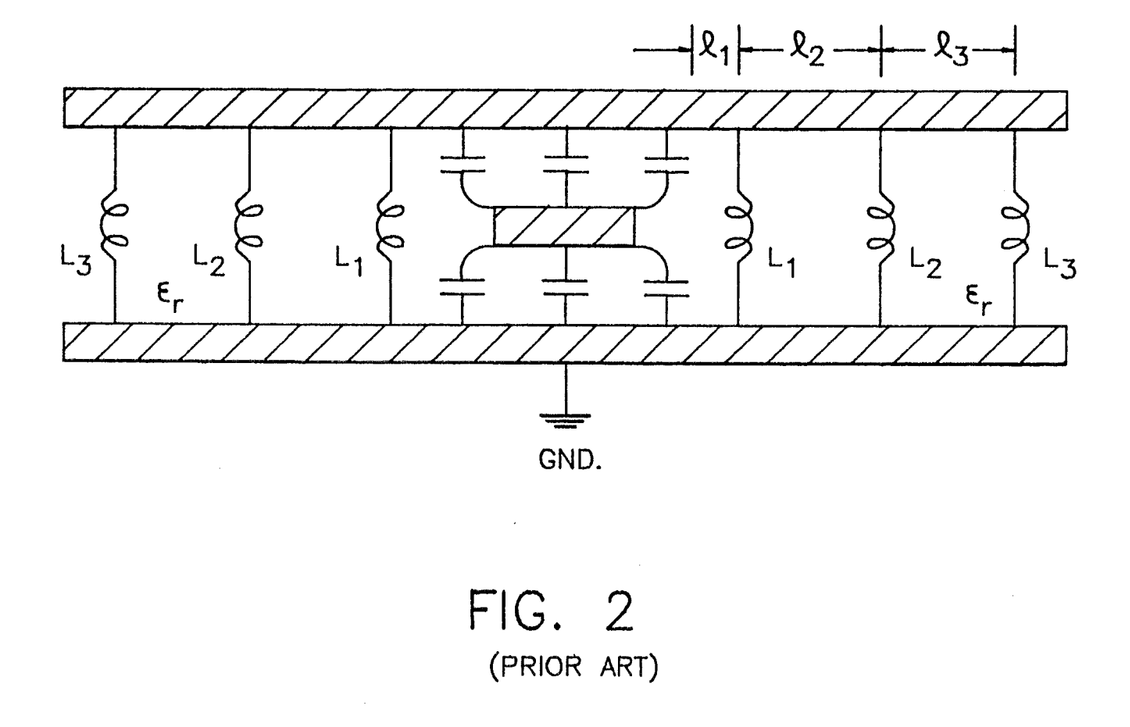
FIG. 2 is a schematic diagram of an equivalent circuit of a prior art device.

When this feedthrough structure is tested over the 1–20 GHz frequency range, a resonance is found in both the forward transmission ($S_{21}$) and forward reflection ($S_{11}$) plots at about 13.9 GHz. This resonance was found to be caused by a parasitic inductance created by the tungsten filled via holes connecting the upper ground plane to the lower ground plane. Because of this finite parasitic inductance, the upper ground plane is not adequately grounded and this causes the excitation of an unbalanced TEM mode when certain frequencies are present. A simple equivalent circuit representation of the structure can be seen in FIG. 2. The parasitic inductances of the via holes and the capacitance between the center conductor of the stripline and the upper ground plane combine to form a band pass filter which shunts the flow of microwave energy on the center conductor to ground at the filter's resonant frequency. To alleviate this problem, it is necessary to move the resonant frequency of this parasitically created filter out of the operational frequency range of the MMIC chip. The subject invention accomplishes this by employing a unique microwave structure which reduces the coupling between the upper ground plane and the center conductor.

SUMMARY OF INVENTION

The invention is an improved feedthrough apparatus for transmitting electromagnetic energy through an aperture in a surface of finite thickness. In the preferred embodiment, it is used for transmitting microwave signals through a wall in a monolithic microwave integrated circuit (MMIC) package. The apparatus consists of a microstrip transmission line section which feeds into a coplanar waveguide (CPW) section which feeds into another microstrip transmission line section. The CPW section is used in the region between the two surfaces of the MMIC package wall in order to guide the signal through the wall. Known prior art devices use stripline transmission line in this region.

The apparatus is an improvement over the prior art because the large capacitive coupling between the center conductor and the coplanar ground pads of the CPW reduces the coupling between the center conductor and the upper ground plane. This reduced coupling effectively increases the resonant frequency of the parasitically created bandpass filter to a point outside the MMIC's operational frequency range and thereby enhances the apparatus' performance in that frequency range.

DETAILED DESCRIPTION OF THE DRAWINGS

The invention is an improved apparatus for transmitting electromagnetic energy through an aperture in a surface of finite thickness. In its preferred embodiment, the invention is used for transmitting microwave energy into or out of a Monolithic Microwave Integrated Circuit (MMIC) package. The invention is an improvement over prior art devices in that it provides enhanced microwave performance over the 1–20 GHz frequency range substantially free of any "in band" resonances. The invention accomplishes this by utilizing a section of coplanar waveguide as a transmission media in the region between the two outer boundaries of the surface of finite thickness. It should be understood that although coplanar waveguide, in the strict sense of the term, refers to a center conductor flanked on each side by coplanar ground pads, with a substrate below having no lower boundary and free space above, in the present specification and in the appended claims the term will also include any transmission medium wherein the predominant transmission mode is the coplanar waveguide mode, whether or not said transmission medium includes an upper or lower ground plane or an upper substrate.

Figure 3A:
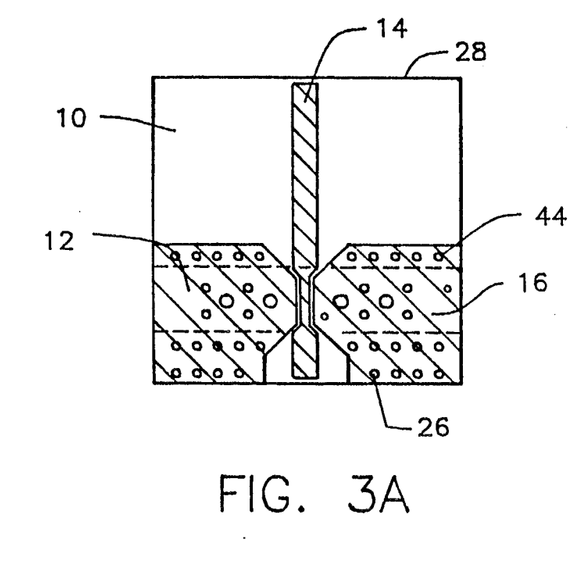
FIG. 3A is a top view of the feedthrough metallization configuration of the preferred embodiment of the present invention.
Figure 3B:
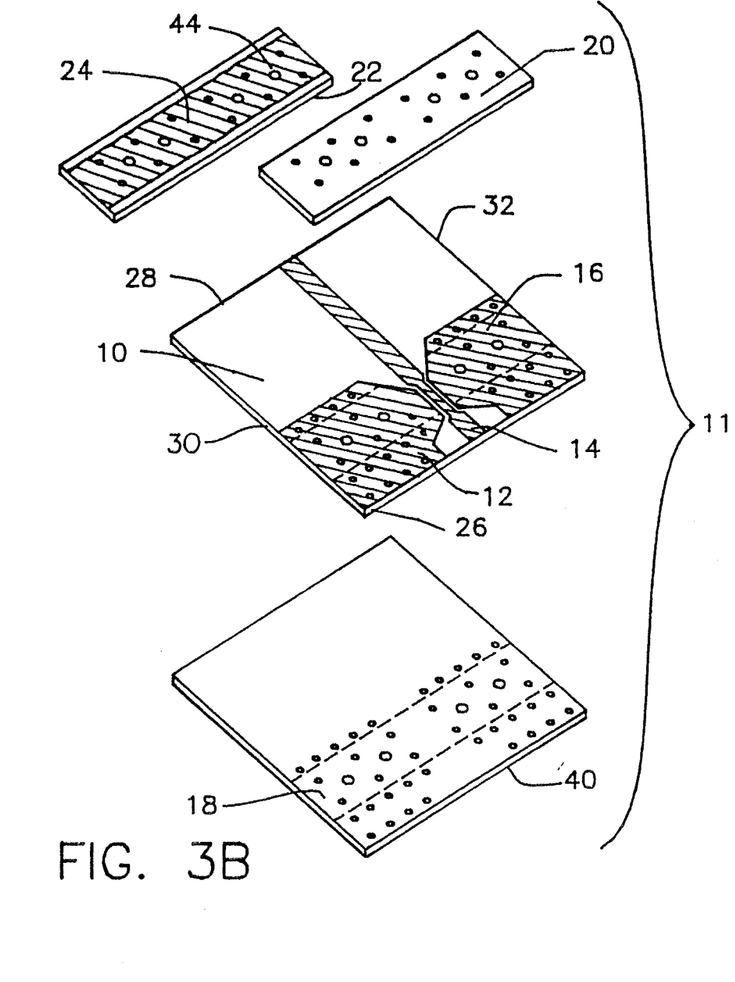
FIG. 3B is an exploded perspective view of the preferred embodiment of the present invention.
Figure 4:
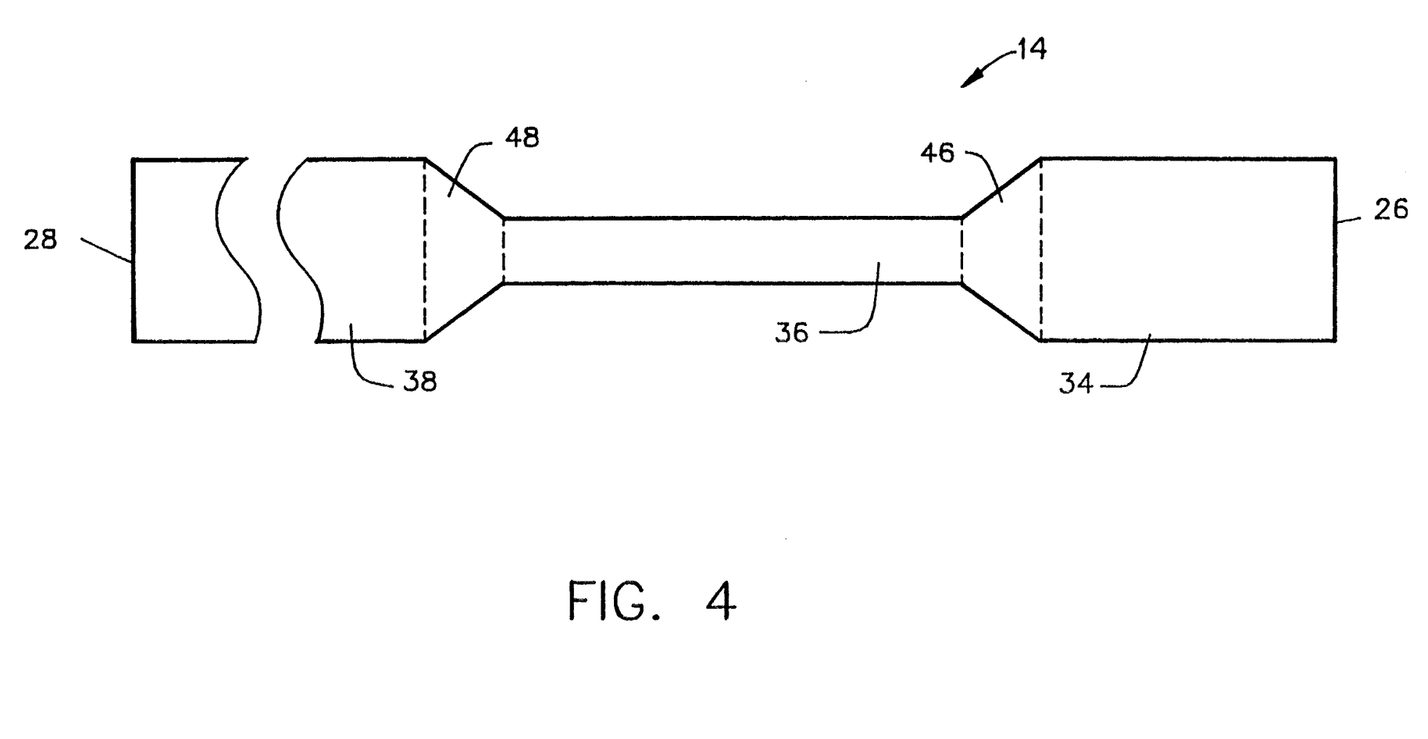
FIG. 4 is a detailed view of a metallization region included in the preferred embodiment of the present invention.

FIGS. 3A and 3B show the preferred embodiment of the invention comprising ceramic substrates 10, 18, 20, and 22, and associated metallization. Substrate 10 has conductive strip 14 and conductive ground pads 12 and 16 deposited on its upper surface. As can be seen in FIGS. 3A, 3B, and 4, conductive strip 14 extends from edge 26 to opposite edge 28 of substrate 10 and consists of five subregions: microstrip subregion 34, coplanar waveguide subregion 36, microstrip subregion 38, and transition subregions 46 and 48. These metallization subregions each act as the center conductor of a microwave transmission line in their respective regions. Conductive ground pads 12 and 16 occupy the two corners created by edge 26 and edges 30 and 32 of substrate 10, respectively. These two ground pads each come in close contact with coplanar waveguide subregion 36 of conductive strip 14, on either side, with a small uniform gap separating each of them from subregion 36. Substrate 18 has lower ground plane 40 deposited onto its lower surface and entirely covering that surface. Substrate 20 has no metallization and substrate 22 has upper ground plane 24 deposited onto its upper surface. When the components of the device are assembled as described hereinbelow, via holes 44 will extend through the assembled device to electrically connect the ground pads 12 and 16 and ground planes 40 and 24.

Figure 5:
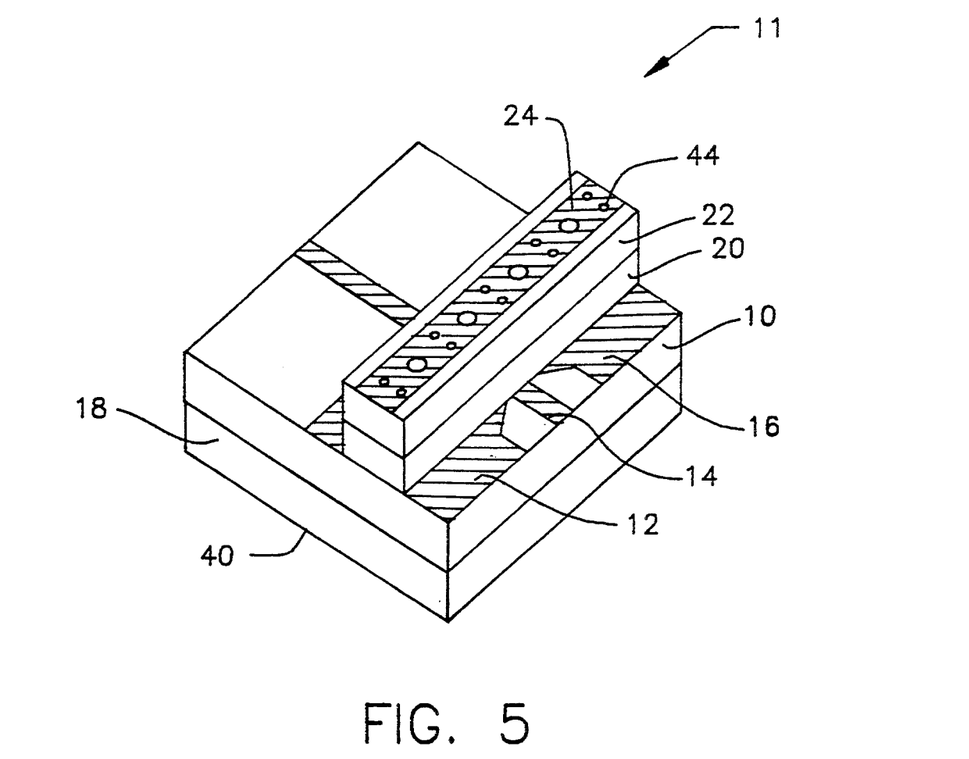
FIG. 5 is a perspective view of the preferred embodiment of the present invention.
Figure 6:
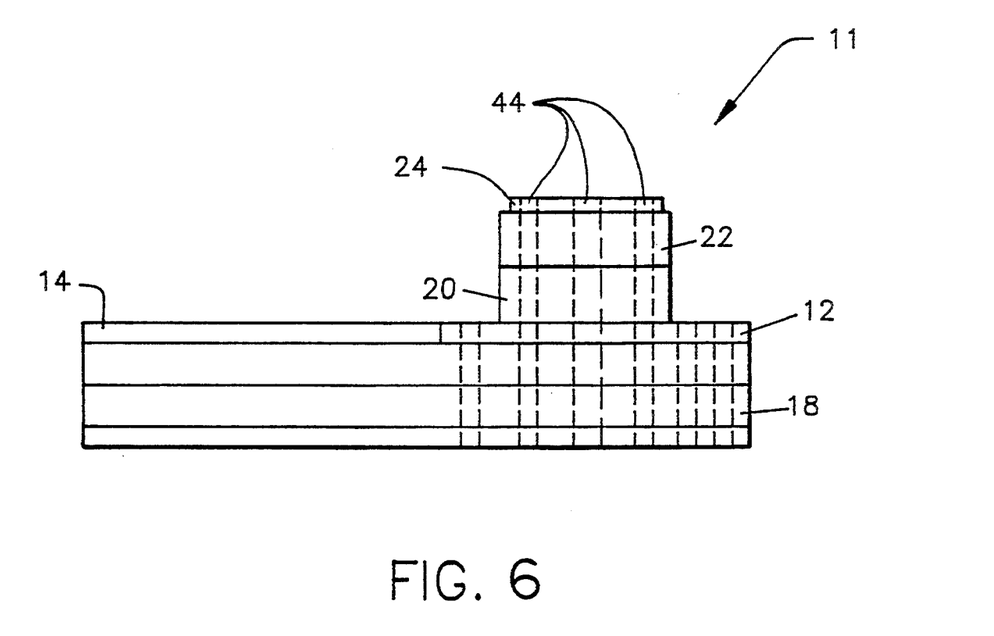
FIG. 6 is a side view of the preferred embodiment of the present invention.

In the preferred embodiment of the invention, the components will be joined together as in FIGS. 5 and 6. Substrate 20 will rest on top of substrate 10 and cover coplanar waveguide subregion 36, transition subregions 46 and 48, and a portion of ground pads 12 and 16. Substrate 22, which is of the same horizontal dimensions as substrate 20, will rest on top of substrate 20 and completely cover its upper surface. Substrate 18, which is of the same horizontal dimensions as substrate 10, will lie below substrate 10 and completely cover its lower surface. The via holes 44 will extend through the device from top to bottom at various locations on ground plane 24 and ground pads 12 and 16. The holes will have their inner surfaces metallized in order to create an electrical connection between ground plane 24, ground plane 40, and ground pads 12 and 16.

Microstrip subregions 34 and 38 of conductive strip 14, in conjunction with substrates 10 and 18 and ground plane 40, each act as the center conductor of a microstrip transmission line section in their respective regions. Coplanar waveguide subregion 36 of conductive strip 14, in conjunction with substrates 10, 18, 20, and 22, ground planes 24 and 40, and Found pads 12 and 16, acts as the center conductor of a coplanar waveguide transmission line.

Figure 7:
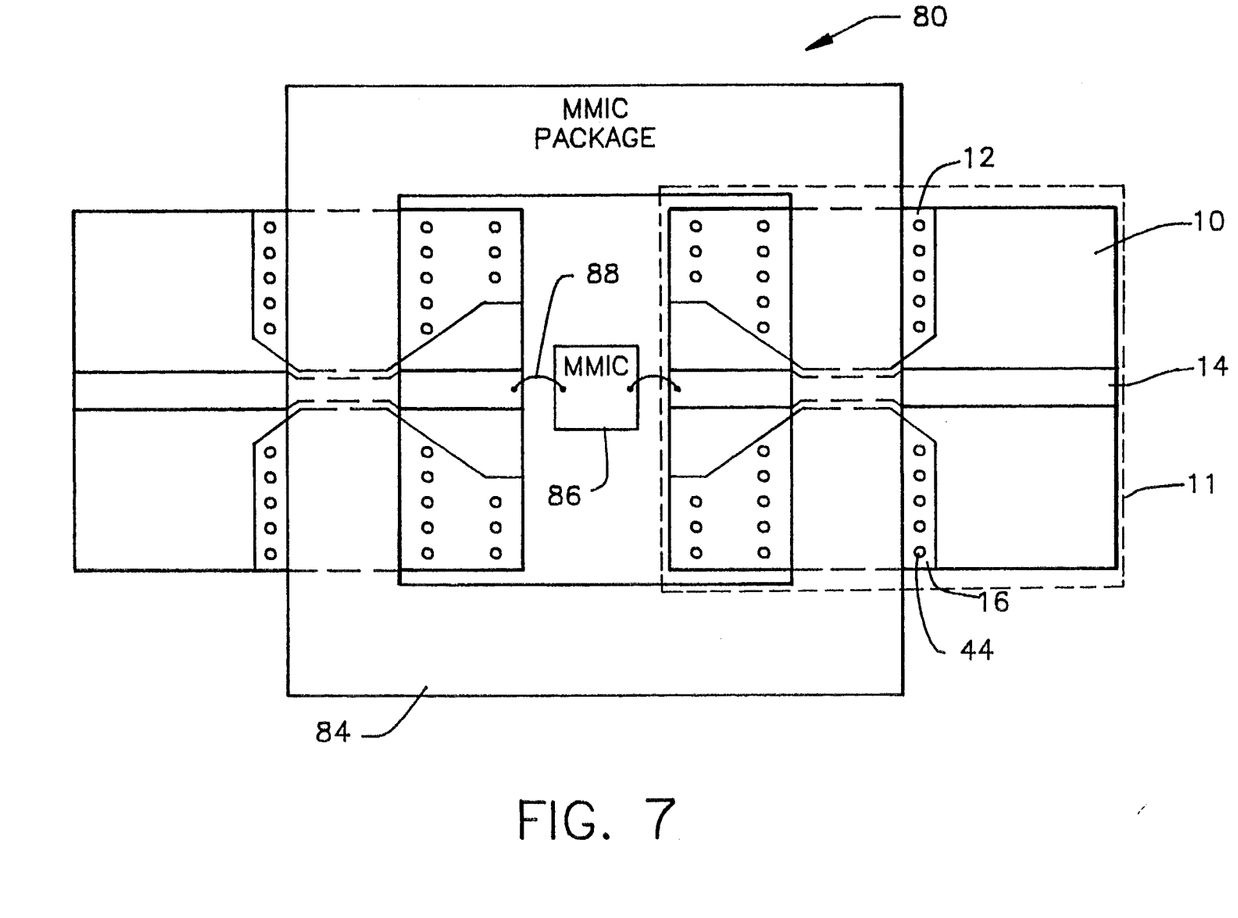
FIG. 7 is a top view of one application of the preferred embodiment of the present invention.
Figure 8:
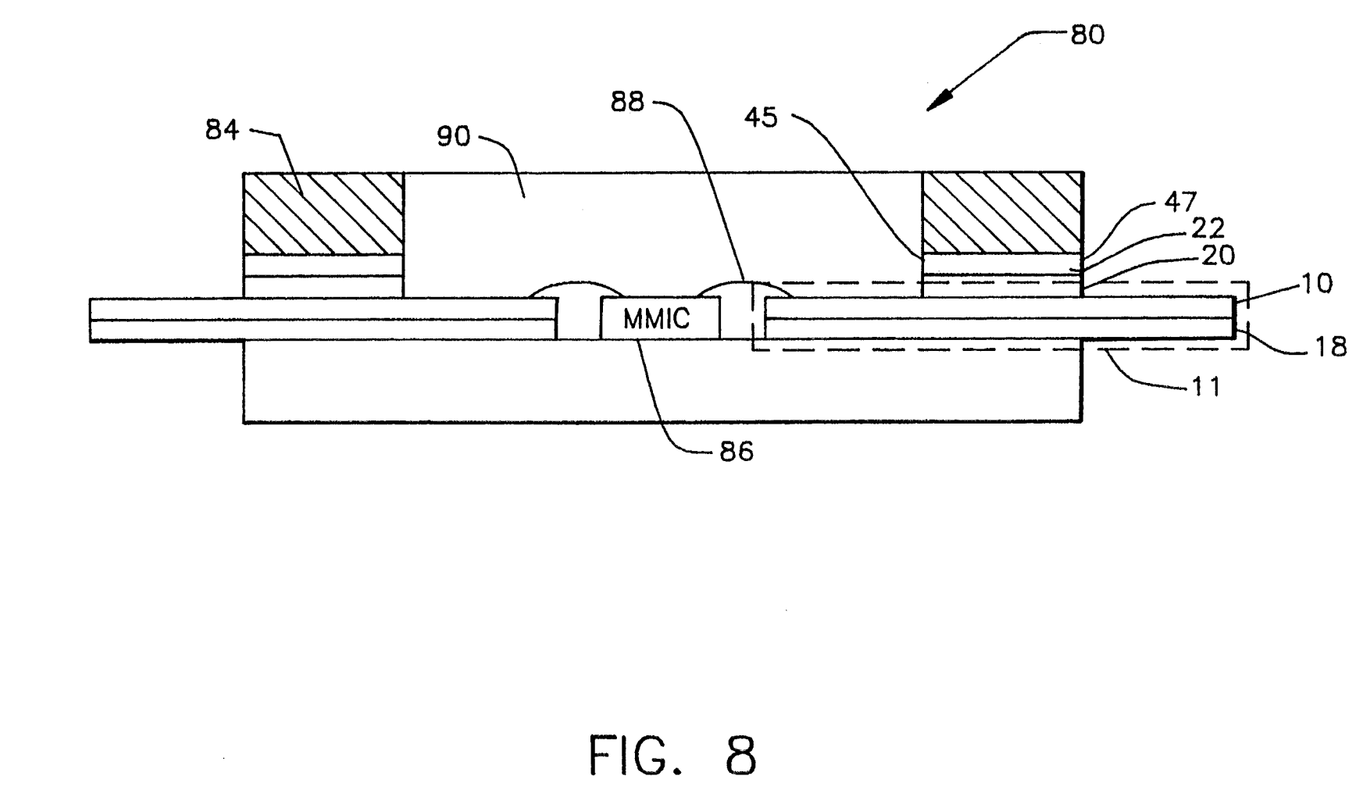
FIG. 8 is a cross sectional side view of one application of the preferred embodiment of the present invention.
Figure 9:
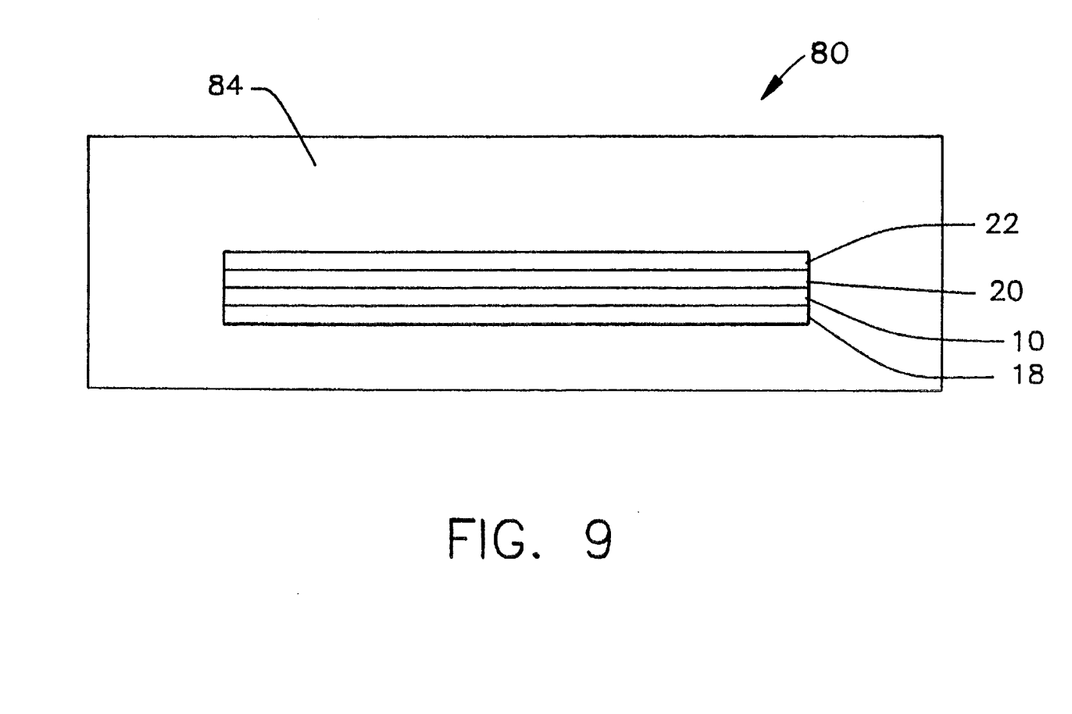
FIG. 9 is a side view of one application of the preferred embodiment of the present invention.

In its preferred embodiment, the invention will be pan of a larger package assembly 80 (see FIGS. 7, 8, and 9). The package assembly will include a metallic housing 84 having four walls and a floor, an internal cavity 90, one or more feedthrough devices 11, a MMIC device 86 mounted centrally in said cavity on said floor, and means for coupling microwave energy from said invention apparatus to said MMIC device or vice versa. The package assembly will further include a lid (not shown in the figures) to cover the top of the housing and various DC signal input ports (also not shown in the figures). As can be seen in FIG. 9, the invention will be mounted in an aperture in one of the four walls so that the periphery of said aperture surrounds the device across the top of substrate 22, down each side of said apparatus, and across the bottom of substrate 18. The length of substrate 22 will be equal to the thickness of the package wall and, therefore, when the apparatus is properly mounted in the package wall, the inner and outer surfaces of the wall will be flush with edges 45 and 47 of substrate 22, respectively (see FIG. 8). Ground plane 40 will lie flat on the package housing floor.

The invention will operate as either an input device, facilitating the transmission of microwave energy into the MMIC package and delivering it to the MMIC chip, or as an output device, facilitating the transmission of microwave energy from the MMIC chip to the region outside the MMIC package. When the invention is operating as an input device, a microwave signal is applied to microstrip subregion 38 of conductive strip 14 at edge 28. This signal is transmitted longitudinally along microstrip subregion 38 in microstrip transmission mode (TEM) until it reaches transition subregion 48. The signal is transmitted through transition subregion 48 and then enters coplanar waveguide subregion 36. The signal is transmitted along coplanar waveguide subregion 36 in coplanar waveguide mode (TEM) until it enters transition subregion 46. The signal is transmitted through transition subregion 46 and then enters microstrip subregion 34. The signal is transmitted along microstrip subregion 34 until it reaches edge 26 of substrate 10. From edge 26, the signal will be coupled into the MMIC chip through bond wires or similar means. When the invention is operating as an output device, the same sequence occurs in the reverse order.

The function of transition regions 46 and 48 is to provide a smooth interface for the microwave signal as it leaves one form of transmission media and enters another. This effectively cuts down on reflections at the microstrip/coplanar waveguide junctions and thereby improves the feedthrough's overall forward reflection (S11) and forward transmission (S21) performance. In the preferred embodiment of the invention, the characteristic impedance of the two microstrip transmission line sections, having microstrip subregions 34 and 38 as center conductors, will be 50Ω. Similarly, the characteristic impedance of the coplanar waveguide section, having coplanar waveguide subregion 36 as its center conductor, will be 50Ω.

The invention is an improvement over prior art devices because the tight capacitive coupling between coplanar waveguide subregion 36 of conductive strip 14 and ground pads 12 and 16 reduces the coupling between coplanar waveguide subregion 36 and ground plane 24. Because the coupling to the upper ground plane is reduced, the electrical effects of the parasitic via hole inductances are also reduced. In this way, the equivalent circuit of FIG. 2 will be altered and the resonant frequency of the parasitically created filter will be moved upward beyond 20 GHz. Testing of the invention in its preferred embodiment shows no resonances in the operational frequency range of 1–20 GHz. Worst case insertion loss is 0.35 dB and worst case return loss is greater than 20 dB in the 1–20 GHz range.

I claim:

1. A feedthrough device for transmitting electromagnetic energy through an aperture in a surface of finite thickness, substantially free of any "in band" reactive resonance effects over a wide frequency range, comprising:
   a first insulating substrate having a first side and a second side;
   a conductive strip disposed upon said first side of said first substrate, said conductive strip having a first end and a second end;
   means including two conductive ground pads disposed on said substrate wherein one of said ground pads is disposed on one side of said conductive strip and the other of said ground pads is disposed on the other side of said conductive strip, each of said ground pads being proximate to said strip and tightly coupled to said strip, which in conjunction with said strip, form a coplanar waveguide transmission medium capable of transmitting electromagnetic energy from one end of said conductive strip to the opposite end of said conductive strip, wherein said coplanar waveguide transmission medium is mounted in said aperture for purposes of transmitting said electromagnetic energy through said surface of finite thickness;
   wherein Said feedthrough device exhibits a low insertion loss over said wide frequency range.

2. The device of claim 1, further comprising a second insulating substrate having a first side and a second side wherein said first side of said second substrate is situated adjacent to and abutting said first side of said first substrate and covers said conductive strip and said conductive ground pads.

3. The device of claim 2, further comprising:
   a first planar conductive surface being situated adjacent to and abutting said second side of said first substrate;
   a second planar conductive surface being situated adjacent to and abutting said second side of said second substrate; and,
   connecting means for electrically connecting said first planar conductive surface to said second planar conductive surface and to said ground pads.

4. The device of claim 3, wherein said first planar conductive surface is a conductive ground plane deposited on said second side of said first substrate, and said second planar conductive surface is a conductive ground plane deposited on said second side of said second substrate.

5. The device of claim 3, further comprising:
   a first transmission means coupled to said first end of said conductive strip for delivering electromagnetic energy to said first end of said conductive strip, wherein said electromagnetic energy will then propagate longitudinally along said conductive strip, in coplanar waveguide mode, to said second end of said conductive strip.

6. The device of claim 5, further comprising:
   a second transmission means coupled to said second end of said conductive strip for transmitting electromagnetic energy away from said second end of said conductive strip.

7. The device of claim 6, wherein said first transmission means is a microstrip transmission line section.

8. The device of claim 6, wherein said second transmission means is a microstrip transmission line section.

9. The device of claim 7, wherein said second transmission means is a microstrip transmission line section.

10. The device of claim 6, further comprising:
a first transition means situated between said first transmission means and said first end of said conductive strip for providing a smooth transition between said first transmission means and said first end of said conductive strip; and,
a second transition means situated between said second end of said conductive strip and said second transmission means for providing a smooth transition between said second end of said conductive strip and said second transmission means.

11. A feedthrough device for transmitting an electromagnetic signal through an aperture in a wall of a monolithic microwave integrated circuit (MMIC) package, wherein said package includes a housing having a plurality of walls, a floor, and an internal cavity; a MMIC device mounted centrally on said floor in said cavity; and, a lid mounted on top of said housing and covering said cavity; wherein at least one of said walls has an aperture of such dimensions as to accommodate said feedthrough device, said feedthrough device comprising:
a first microstrip transmission line section having a first end and a second end, said first microstrip transmission line being external to said MMIC package;
a coplanar waveguide section having a first end and a second end, wherein said first end is coupled to said second end of said first microstrip transmission line section, and wherein said coplanar waveguide section is of a length approximately equal to the thickness of said package wall and is mounted inside said aperture in said wall, said coplanar waveguide section including a conductive strip disposed on an insulating substrate, two conductive ground pads disposed on said substrate, with one of said ground pads disposed on one side of said conducive strip and the other of said ground pads being disposed on the other side of said conductive strip, each of said ground pads being proximate to and tightly coupled to said strip: and,
a second microstrip transmission line section having a first end and a second end, wherein said first end is coupled to said second end of said coplanar waveguide section, said second microstrip transmission line being internal to said MMIC package inside said cavity; wherein said electromagnetic signal is transmitted through said aperture substantially free of any "in band" reactive resonance effects over a wide frequency range.

12. The device of claim 11, further comprising coupling means for coupling said second end of said second microstrip transmission line section to said MMIC device.

13. The device of claim 12, wherein said device is for transmitting said electromagnetic signal, applied at said first end of said first microstrip transmission line section, to said second end of said second microstrip transmission line section.

14. The device of claim 12, wherein said device is for transmitting said electromagnetic signal, applied at said second end of said second microstrip transmission line section, to said first end of said first microstrip transmission line section.

15. A feedthrough device for transmitting electromagnetic energy through an aperture in a surface of finite thickness, substantially free of any "in band" reactive resonance effects, comprising:
a first insulating substrate having a first side and a second side;
a conductive strip disposed upon said first side of said first substrate, said conductive strip having a first end and a second end;
means including two conductive ground pads disposed on said substrate, wherein one of said ground pads is disposed on one side of said conductive strip and the other of said ground pads is disposed on the other side of said conductive strip and said ground pads are proximate to said strip, which, in conjunction with said strip, form a coplanar waveguide transmission medium capable of transmitting electromagnetic energy from one end of said conductive strip to the opposite end of said conductive strip, wherein said coplanar waveguide transmission medium is mounted in said aperture for purposes of transmitting said electromagnetic energy through said surface of finite thickness;
a second insulating substrate having a first side and a second side wherein said first side of said second substrate is situated adjacent to and abutting said first side of said first substrate and covers said conductive strip and said conductive ground pads;
a third insulating substrate having a first side and a second side, wherein said first side of said third substrate is adjacent to and abutting said second side of said first substrate;
a fourth insulating substrate having a first side and a second side, wherein said first side of said fourth substrate is adjacent to and abutting said second side of said second substrate;
a first planar conductive surface being situated adjacent to and abutting said second side of said third substrate;
a second planar conductive surface being situated adjacent to and abutting said second side of said fourth substrate;
connecting means for electrically connecting said first planar conductive surface to said second planar conductive surface and to said ground pads.

16. The device of claim 1 wherein said wide frequency range is from about 1 GHz to 20 GHz.

17. The device of claim 11 wherein said wide frequency range is from about 1 GHz to 20 GHz.

18. The device of claim 15, wherein said first planar conductive surface is a conductive ground plane deposited on said second side of said third substrate, and said second planar conductive surface is a conductive ground plane deposited on said second side of said fourth substrate.

* * * * *